Aug. 29, 1944. J. F. DREYER, JR Re. 22,537

AUTOMATIC VOLUME CONTROL CIRCUIT

Original Filed Oct. 2, 1934

INVENTOR
JOHN F. DREYER JR.
BY H. S. Grover
ATTORNEY

Reissued Aug. 29, 1944

Re. 22,537

UNITED STATES PATENT OFFICE 22,537

AUTOMATIC VOLUME CONTROL CIRCUITS

John F. Dreyer, Jr., Oceanside, N. Y., assignor to Radio Corporation of America, a corporation of Delaware Original No. 2,107,409, dated February 8, 1938, Serial No. 746,495, October 2, 1934. Application for reissue December 13, 1938, Serial No. 245,483

9 Claims. (Cl. 250—20)

Figure 1:
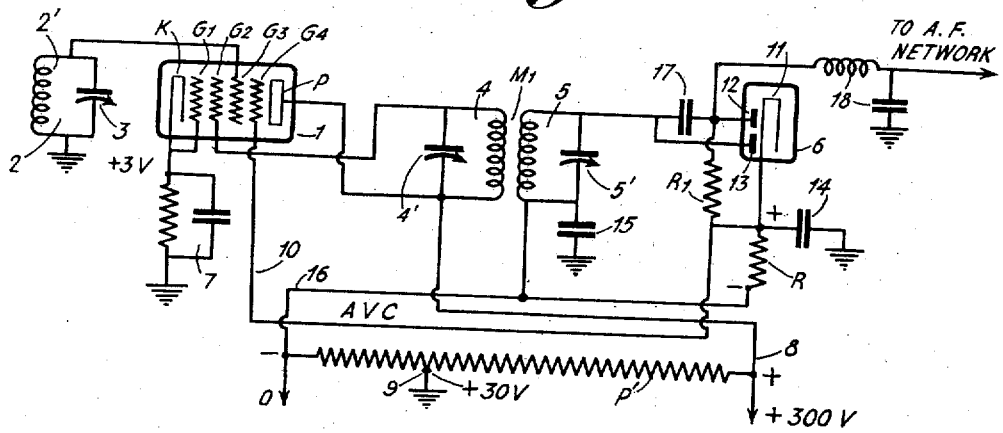

My present invention relates to gain control circuits for signal transmission systems, and more particularly to automatic gain control networks for radio receivers employing signal transmission tubes having negative mutual conductance characteristics.

Automatic volume control systems usually employed in present day broadcast receiver constructions are of a type wherein a diode signal rectifier is connected to the controlled amplifier output. A high impedance is disposed in the space current path of the diode so that the anode of the diode becomes more negative with increasing signals. The signal grids of the controlled amplifiers are connected to the diode anode so that an increase in intensity of received signals results in a reduction of the mutual conductance, and gain, of the amplifiers. This action results by virtue of the increased negative bias applied to the amplifier grids. In such systems of the prior art it is essential that the signal grid of the controlled amplifier be connected to an electrode of the control rectifier which becomes increasingly negative in direct current potential as the received signal amplitude increases.

Now, I have discovered that automatic volume control action may be secured in receivers employing the aforesaid type of system without utilizing the essential requirement already referred to. In fact, similar action can be obtained, according to my present invention, by employing connections wherein the controlled amplifier decreases in mutual conductance, and gain, when an electrode thereof varies in potential in a positive sense. Thus, the automatic volume control connection may be made to an electrode of the control rectifier which varies in potential in a positive direction as the received signal amplitude increases. The controlled amplifier is provided with a negative mutual conductance characteristic to secure the present gain control system.

Hence, it may be stated that it is one of the main objects of the present invention to provide as an amplifier of high frequency signals a tube having a negative mutual conductance characteristic, the tube having its gain decreased by regulating the voltage of an electrode of the tube, which is initially at a negative, or zero, voltage with respect to the cathode, in a sense such that it is more positive than its initial value.

Another important object of the present invention is to provide an automatic gain control system for a radio receiver of the type including at least one high frequency amplifier which is provided with a tube having a cathode, a signal grid, an output electrode, an auxiliary positive electrode, and a special gain control electrode disposed between the output electrode and the auxiliary electrode, the gain control system including a rectifier having in its circuit an impedance across which is developed a direct current potential varying in value as the received signal amplitude varies, a direct current connection being provided between the special gain control electrode of the amplifier and a point on the voltage impedance.

Still another object of the invention is to provide a radio receiver with a high frequency amplifier having a negative mutual conductance characteristic, a signal grid of the amplifier having a substantially high negative normal bias, and there being a gain control connection between the signal grid of the amplifier and an electrode of the rectifier which varies in a positive sense as regards direct current potential.

And still other objects of the invention are to improve generally automatic volume control systems for radio receivers, and to especially provide an automatic volume control arrangement, for a radio receiver of the type employing high frequency amplifiers having negative mutual conductance characteristics, which is not only reliable, free from distortion and cross-talk and efficient in operation, but economically assembled.

The novel features which I believe to be characteristic of my invention are set forth in particularity in the appended claims, the invention itself, however, as to both its organization and method of operation will best be understood by reference to the following description taken in connection with the drawing in which I have indicated diagrammatically several circuit organizations whereby my invention may be carried into effect.

In the drawing:—

Figure 2:
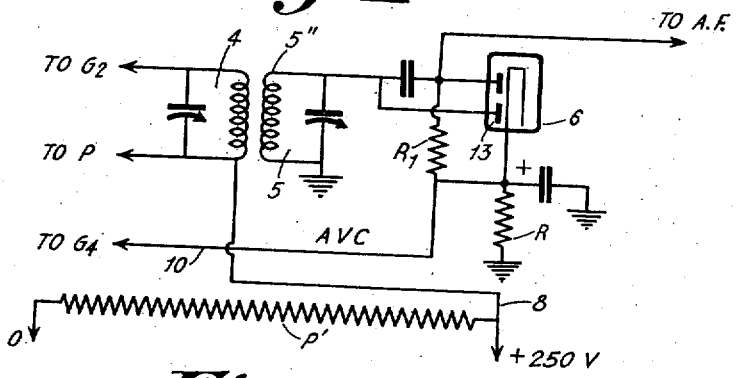
Figure 3:
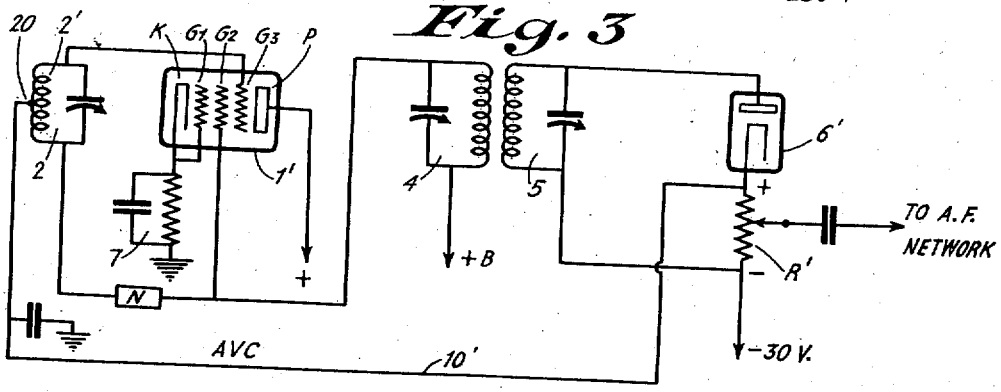

Fig. 1 is a circuit diagram of an amplifier gain control system embodying the invention, Fig. 2 shows a modified form of the circuit of Fig. 1, Fig. 3 diagrammatically shows still another modification.

Referring now to the accompanying drawing, wherein like reference characters in the different figures designate similar circuit elements, there is shown in Fig. 1 a tube, denoted by the numeral 1, arranged to be tuned by resonant network 2 to a desired signal frequency. The tube 1 is adapted to function as an amplifier in the system shown, and the resonant network 2 includes a coil 2′ and condenser 3. The latter may be adjustable for tuning the amplifier through a desired range of signal frequencies, as the broadcast range, and in such a case the amplifier is to be understood as representing one, or more, stages of tuned radio frequency amplification used in a superheterodyne receiver or in a T. R. F. type of receiver. The condenser 3 may be fixed, as in the case of the intermediate frequency amplifier of a superheterodyne receiver.

The amplifier 1 is provided with a tuned output network 4, and the latter is coupled, as at $M_1$, to the tuned input network 5 of the following rectifier tube 6. The condensers 3, 4', 5' are uni-controlledly adjustable where the receiver is of the T. R. F. type; in the case of superheterodyne reception these condensers fixedly tune the circuits to the operating intermediate frequency. It is to be clearly understood that a signal collector may be coupled to circuit 2 through one, or more, tube stages similar to tube 1, and, furthermore, that circuit 4 may be coupled to the rectifier input network 5 through similar stages.

The tube 1 has a negative mutual conductance characteristic. That is to say the plate resistance, and gain, of the tube vary when the potential of a gain control electrode of the tube is varied in a positive potential direction with respect to the cathode. Specifically, the tube 1 is provided with a cathode K, of the indirectly heated type, a plate or collector electrode P, and three intermediate cold electrodes $G_2$—$G_3$—$G_4$. The electrode $G_2$ is connected to the high alternating potential side of the output or work network 4, and functions as the anode, or output, electrode of the amplifier 1.

Electrode $G_3$ is connected to the high alternating potential side of the signal input network 2, the cathode K being connected to ground through the usual signal grid biasing network 7. The low alternating potential side of the network 2 is grounded, and the resistor of network 7 is given a value such that the electrode $G_3$ has a negative bias of three volts with respect to cathode K. The electrode P is connected to the low alternating potential side of output circuit 4, and both electrodes P and $G_2$ are maintained at a relatively high direct current potential with respect to cathode K by connecting both electrodes to the positive side (+300 volts) of voltage supply potentiometer P' through lead 8.

The point 9 on potentiometer P' is grounded, and may be chosen at a point thereon having a voltage value of about 30 volts with respect to the negative end. The tube 1, then, is of a type wherein the output or work electrode thereof is disposed between a positive waste electrode and the cathode, the signal electrode being interposed between the output electrode and the positive waste electrode. By varying the potential of the space between the signal electrode and the positive electrode in a positive direction, it is possible to decrease the mutual conductance of the signal electrode toward the output or work electrode. That is to say, when the potential of electrode $G_4$ in tube 1 is made increasingly positive with respect to cathode K, electrons will be diverted away from the output electrode $G_2$ and attracted towards the collector, or waste, electrode P. By the term "waste electrode" is meant the electrode P which functions to rob the useful output electrode $G_2$ of its electrons when the grid $G_4$ in Fig. 1 is made increasingly positive; the term "waste," "diversion" and "collector" are to be considered synonymous in describing the function of electrode P. This action manifests itself in a decrease in gain of tube 1.

Advantage is taken of this negative mutual conductance characteristic of tube 1 by regulating the gain thereof in response to received signal current variations. The electrode $G_4$ is connected by lead 10 to a point in the rectifier space current path whose voltage varies in a positive direction with respect to the cathode K as received signals increase in intensity. For this reason the lead 10 is designated "AVC" to denote that it is the automatic volume control path of the receiver.

The rectifier 6 is shown as including a cathode 11 and a pair of anodes 12, 13. The anode 13 is connected to cathode 11 through a path including, in series, the coil of circuit 5 and resistor R, the cathode side of the resistor being grounded through by-pass condenser 14, and the low alternating potential side of network 5 being similarly grounded through condenser 15. The lead 10 is connected to the cathode side of resistor R. A lead 16 connects the anode 13 to the negative side of potentiometer P' through the coil of circuit 5, while the same lead is connected to the negative side of resistor R.

The rectifier 6 is employed as an audio demodulator by connecting the anode 12 to the high alternating voltage side of network 5 through radio frequency by-pass condenser 17. Resistor $R_1$ connects the cathode side of resistor R to the anode 12. The audio frequency component of rectified signal currents is transmitted to a later audio utilization network through filter 18. The utilization network may comprise one, or more, audio amplifier tubes followed by a reproducer. If desired, the tube 6 may be of the 55 type; that is, a tube including a pair of diodes and a triode, or pentode, in a common tube envelope. Such a multi-function tube is well known to those skilled in the art, and need not be described in further detail.

It is desirable that the volume control electrode $G_4$ have at all times a high impedance so that variations in its potential may be effected by voltages obtained from the diode rectifier. The tube 1 may assume different constructional forms. As shown in Fig. 1, the electrodes $G_2$—$G_3$—$G_4$ are the grids of a 57 type tube, and the suppressor grid thereof, denoted by the reference character $G_1$, is at cathode potential, and disposed between the cathode and output grid $G_2$. Any other type of tube construction may be employed; the prime factor of voltage and geometric design is that the tube shows a negative mutual conductance characteristic.

In actual operation, as the signals of a desired frequency increase in intensity, the cathode side of resistor R will become increasingly positive with respect to the cathode K of the controlled amplifier. The electrode $G_4$ is initially negative with respect to the cathode K. This arrangement in Fig. 1 results in the gain control electrode $G_4$ becoming more positive with respect to the cathode K, and a diversion of electrons from output or work electrode $G_2$ takes place. Thus, the gain of tube 1 decreases; the signal intensity at the network 5 is thereby maintained substantially constant in value. If undesirable effects occur due to feedback between the input and output circuits of tube 1, it is only necessary to use any well known type of neutralization circuit; or, a screen grid may be employed between grids $G_2$ and $G_3$.

In Fig. 2 is shown a modification of the system.

Only such circuit details are shown which are essential to a clear understanding of the changed circuit. The ground connection from point 9 on potentiometer P′ has been omitted, and a voltage of about 250 volts is applied to the electrodes $G_2$ and P. The diode anode 13 is connected to ground through coil 5″, and the negative side of resistor R is grounded. In this case, the electrode $G_4$ has an initial potential which is zero, or positive, with respect to the voltage of cathode K.

The AVC connection may, of course, be extended to the gain control electrodes of additional amplifiers in the system, which amplifiers may be of a construction similar to that of tube 1. Further, a low pass filter may be inserted in the AVC path, in Fig. 1 or Fig. 2, to suppress all low frequency ripples created in the rectifier network. Although it is highly desirable to have a special electrode function as the gain control electrode, it is within the scope of the present invention to utilize another electrode, such as the signal grid, for this function. In Fig. 2 the voltage of electrode $G_4$ becomes more positive as signals increase in amplitude. In Fig. 1, the voltage of $G_4$ becomes less negative.

In Fig. 3 is shown a tube 1′ similar to tube 1 in Fig. 1, with the exception that the grid $G_4$ has been omitted. The AVC lead 10′ is connected between the cathode side of resistor R′ and the signal grid $G_3$ by connecting the grid side of lead 10′ to an intermediate tap 20 on input coil 2′. The diode rectifier 6′ is shown as including only a single anode, and the anode side of resistor R′ is connected to a source of high negative bias, such as −30 volts, for the signal grid $G_3$. A neutralization path N is provided between the input circuit 2 and output electrode $G_2$ to compensate for feedback effects that may arise.

The tube 1′ has a negative mutual conductance characteristic. In order to insure gain control action the signal grid $G_3$ is given an initial, fixed, high negative bias. Variation of the potential of grid $G_3$ in a positive potential direction, thereafter, will result in a decrease in the electrons flowing through the output electrode network. There occurs, thus, a decrease in the gain of the tube; or, put another way, the mutual conductance of the signal grid $G_3$ toward the output electrode $G_2$ decreases.

While I have indicated and described several systems for carrying my invention into effect, it will be apparent to one skilled in the art that my invention is by no means limited to the particular organizations shown and described, but that many modifications may be made without departing from the scope of my invention, as set forth in the appended claims.

What is claimed is:

1. In a signaling system, an electron discharge tube amplifier having a cathode, an output electrode, a waste electrode and a control electrode, an electron discharge tube detector coupled to the output circuit of said amplifier, said detector having at least a cold electrode and a cathode, means for causing the cathode electrode of said detector to become more positive in the presence of an amplified signal, a direct current connection between said control electrode and said detector cathode electrode, the amplifier output circuit being connected to said output electrode, means connecting said waste electrode to a point of substantially low alternating potential on said amplifier output circuit, means for maintaining the output and waste electrodes positive with respect to the control electrode, and the control electrode being so geometrically related to the output and waste electrodes that the mutual conductance between the output and control electrodes is reduced and that between the control and waste electrodes increased and the amplification of said amplifier is automatically decreased as the received signal amplitude increases.

2. In a modulated carrier current signalling system, employing a carrier current amplifier provided with an output electrode, a waste electrode and a gain control element, a rectifier which produces a uni-directional voltage from the carrier current, a direct current connection from said rectifier to said element of said amplifier whereby the amplification is regulated automatically, means for normally maintaining the output and waste electrodes at a positive potential with respect to the said control element, said amplifier having its said element geometrically related in such a manner to said output and waste electrodes that it is provided with a negative mutual conductance characteristic between the output electrode and the control element, and said direct current connection to said rectifier being made to an electrode of the rectifier which becomes more positive with respect to the amplifier cathode in the presence of an amplified signal, said amplifier having an output circuit, said waste and output electrodes being connected to said output circuit, and the output electrode being connected to a point of substantially higher alternating potential on said output circuit than said waste electrode.

3. In a signalling system, an amplifier having a cathode, an output or work electrode, signal grid, an auxiliary positive waste electrode, and a gain control electrode disposed between the output electrode and the auxiliary electrode, a signal rectifier coupled to said amplifier output electrode, said rectifier having an output electrode, means for normally maintaining said rectifier output electrode at least at the same voltage as the amplifier cathode, means for causing said rectifier output electrode to become more positive in the presence of an amplified signal, said amplifier having an output circuit connected between the cathode and its output electrode, the waste electrode being connected to the low alternating potential side of the output circuit, and the amplifier output electrode being positioned closer to the cathode than said waste electrode, and a direct current connection between said rectifier output electrode and the said gain control electrode of the amplifier whereby the amplification of said amplifier is regulated in a decreasing sense when the received signal amplitude increases.

4. In a signalling system, a signal transmission tube having its electrodes geometrically related in such a manner that it is provided with a negative mutual conductance characteristic, said tube including at least a cathode, a signal electrode, an output electrode and means including an electrode in said tube for regulating the flow of electrons from said cathode to said output electrode, a signal rectifier coupled to said tube, said rectifier including at least a cathode and an anode, means including a high resistance connected between the rectifier anode and cathode, said last cathode becoming more positive in the presence of an impressed signal, the output electrode being disposed between the transmission tube cathode and said regulating electrode to permit diversion of electrons from the output electrode as the regulating electrode potential is shifted in a positive direction, and a direct current connection between said rectifier cathode and the first named means whereby the signal transmission of said tube is automatically regulated in a decreasing sense when the received signal amplitude increases.

5. In a signalling system, a signal transmission tube having its electrodes geometrically related in such a manner that it is provided with a negative mutual conductance characteristic, said tube including at least an electron emitter, an output electrode, an electrode to receive electrons diverted from the output electrode, and a control electrode for regulating the diversion of electrons from said output electrode, a succeeding tube including an input circuit coupled to the output electrode of said first tube, the succeeding tube including an electrode whose potential becomes increasingly positive with respect to the emitter of said first tube when the received signal amplitude increases, and a direct current connection between the said electrode of the second tube and the control electrode of the first tube whereby the signal transmission efficiency through the first tube decreases when the signals impressed on the second tube vary in amplitude in an increasing sense.

6. In a signalling system, an amplifier having a cathode and a signal control electrode and having its electrodes geometrically related so as to impart a negative mutual conductance characteristic to the amplifier, a rectifier coupled to said amplifier, said rectifier including at least an anode and a cathode, means for maintaining said cathode normally negative relative to said amplifier cathode, means for causing said cathode to become more positive in the presence of an amplified signal, and a direct current connection between said control electrode and said cathode whereby the control electrode becomes less negative, and the amplification of said amplifier is regulated automatically to decrease, in the presence of amplified signals, means for normally maintaining the said signal control electrode of the amplifier at a substantially high negative potential with respect to the amplifier cathode.

7. In a signal system, an amplifier having a cathode and a negative signal control electrode and having its electrodes geometrically related so as to impart a negative mutual conductance characteristic to the amplifier, a rectifier coupled to said amplifier, said rectifier including at least an anode and a cathode, means for maintaining said cathode normally negative relative to said amplifier cathode, means for causing said cathode to become more positive in the presence of an amplified signal, and a direct current connection between said control electrode and said cathode whereby the control electrode becomes less negative, and the amplification of said amplifier is regulated automatically to decrease, in the presence of amplified signals, said amplifier including an output electrode disposed between the amplifier cathode and the said signal control electrode, and an auxiliary positive cold electrode, said signal electrode being disposed between the output electrode and said auxiliary electrode.

8. In a signal amplifying system of the type employing a rectifier and a tube having at least a cathode, an anode and a control grid, said tube having a signal input circuit connected to said grid and an output circuit connected to the anode; the method which includes applying signals to the input circuit, deriving amplified signals from said output circuit, rectifying at said rectifier the amplified signals to derive a control voltage, and controlling the electron stream in said tube in response to said control voltage so that a considerable portion of the current through the cathode, deriving from the electron stream, is diverted from the anode output circuit when the input signal amplitude exceeds a predetermined value.

9. In a signalling system, a signal transmission tube having its electrodes geometrically related in such a manner that it is provided with a negative mutual conductance characteristic, said tube including at least an electron emitter, an output electrode, an electrode to receive electrons diverted from the output electrode and a control electrode for regulating said diversion, means for deriving from signals a control voltage which becomes increasingly positive with signal amplitude increase, and means for applying the control voltage to said control electrode thereby to increase said diversion in response to said signal amplitude increase.

JOHN F. DREYER, JR.